(12) United States Patent
Kaneko et al.

(10) Patent No.: US 7,071,536 B2
(45) Date of Patent: Jul. 4, 2006

(54) SEMICONDUCTOR DEVICE AND MANUFACTURING METHOD THEREOF

(75) Inventors: Saichirou Kaneko, Kyoto (JP); Masakatsu Hoshi, Yokohama (JP); Yoshinori Murakami, Tokyo (JP); Tetsuya Hayashi, Yokosuka (JP); Hideaki Tanaka, Yokosuka (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 10/772,283

(22) Filed: Feb. 6, 2004

(65) Prior Publication Data

US 2004/0183079 A1  Sep. 23, 2004

(30) Foreign Application Priority Data

Feb. 14, 2003  (JP) .......................... P2003-036364

(51) Int. Cl.
*H01L 27/082* (2006.01)
(52) U.S. Cl. .................. 257/565; 438/205; 438/313; 438/340
(58) Field of Classification Search ................ 257/565, 257/575; 438/205, 313
See application file for complete search history.

(56) References Cited

U.S. PATENT DOCUMENTS 6,737,722 B1 * 5/2004 Yamamoto et al. ......... 257/500

OTHER PUBLICATIONS

Yi. Tang et al., "Improvement and Analysis of Implanted-Emitter Bipolar Junction Transistors in 4H-SiC", Materials Science Forum vols. 389-393 (2002), pp. 1329-1332.

* cited by examiner

*Primary Examiner*—Fetsum Abraham
(74) *Attorney, Agent, or Firm*—McDermott Will & Emery LLP (57) ABSTRACT

A high voltage semiconductor device having a high current gain hFE is formed with a collector region (20) of a first conduction type, an emitter region (40) of the first conduction type, and a base region (30) of a second conduction type opposite to the first conduction type located between the collector region and the emitter region. The free carrier density of the base region (30) where no depletion layer is formed is smaller than the space charge density of a depletion layer formed in the base region (30).

12 Claims, 7 Drawing Sheets

SEMICONDUCTOR DEVICE AND MANUFACTURING METHOD THEREOF

BACKGROUND OF THE INVENTION

1. Field of the Art

This invention relates to a semiconductor device and a manufacturing method thereof.

2. Description of the Related Art

In recent years, the research of semiconductor devices has been increasingly conducted by use of the very chemically stable nature of silicon carbide (SiC). Silicon carbide has a larger energy gap Eg, as compared with silicon, for example, Eg=3.3 eV in the case of 4H type crystals, to have a high withstanding voltage and therefore expected to be applied to power devices such as an electric power controlling device.

An exemplary SiC bipolar transistor comprises a high-concentration $n^+$-type SiC substrate on which are laminated the $n^-$-type epitaxial region, a p-type base region, and the $p^+$-type contact region in this order. The topmost $p^+$-type contact region is partially removed to expose part of the p-type base region located thereunder. An $n^+$-type emitter region is formed in the surface layer of the p-type base region as exposed. An interlayer film is formed on the surface of the $n^+$-type emitter region and the surface of the $p^+$-type contact region serves to protect and stabilize the surfaces and the junction surfaces thereof while an emitter electrode and a base electrode is formed through contact holes opened through the interlayer film. Also, an collector electrode is formed on the rare surface of the SiC substrate.

In operation of this vertical bipolar transistor having a high withstanding voltage for high power applications, a larger collector current can be generated from the collector electrode to the emitter electrode in response to a smaller base current passed from the base electrode to the emitter electrode. Features reside in that a large quantity of carriers are injected to an $n^-$-type epitaxial layer having a high specific resistance to cause conductivity modulation and decrease the "on" resistance of the semiconductor device. If no voltage is applied to the base electrode, no base current flows to electrically insulate between the collector electrode and the emitter electrode and realize a switching operation.

SUMMARY OF THE INVENTION

The SiC bipolar transistor of high withstanding voltage has the following problems.

It is required for realizing a high withstanding voltage to prevent punch-through, which is a phenomenon that, due to the reverse voltage applied to a collector electrode, a depletion layer is expanded in a p-type base region to reach an $n^+$-type emitter region. For this purpose, the space charge density of the depletion layer has to be increased within the p-type base region in order not to inhibit the expansion of the depletion layer. However, when the space charge density increases, the free carrier density in the p-type base region also increases to decrease the emitter injection efficiency and therefore decrease the current gain hFE. As a result, a larger base current is required for controlling the collector current.

That is, there is a problem that a tradeoff exists between the withstanding voltage of the device and the current gain hFE.

The invention has been made in order to solve the problems as described above. It is an object of the invention to provide a high withstanding voltage semiconductor device having a high current gain hFE.

To achieve the object, according to a first aspect of the invention, a semiconductor device comprises: a collector region of a first conduction type; an emitter region of the first conduction type; and a base region of a second conduction type opposite to the first conduction type located between the collector region and the emitter region, wherein the free carrier density of the base region where no depletion layer is formed is smaller than the space charge density of a depletion layer formed in the base region.

According to a second aspect of the invention, a semiconductor device comprises: a collector region of a first conduction type; an emitter region of the first conduction type; and a base region of a second conduction type opposite to the first conduction type located between the collector region and the emitter region, wherein the base region includes a punch-through stop region of the second conduction type adjacent to the emitter region, and wherein the free carrier density of the punch-through stop layer where no depletion layer is formed is smaller than the space charge density of a depletion layer formed in the punch-through stop region.

According to a third aspect of the invention, a semiconductor device comprises: a collector region of a first conduction type; and a base region of a second conduction type opposite to the first conduction type formed on the collector region; and an emitter region of the first conduction type formed on the base region, wherein the collector region, the base region and the emitter region are made of a silicon carbide semiconductor, wherein the base region is doped with boron.

According to a fourth aspect of the invention, there is provided a manufacturing method of manufacturing a semiconductor device according to the first aspect of the invention, the manufacturing method comprising: forming the base region by use of a first impurity of a second conduction type which serves to generate an impurity level with a predetermined depth from the edge of the band gap of a base semiconductor material of the semiconductor device while the free carrier density is smaller than the space charge density by a predetermined value.

According to a fifth aspect of the invention, there is provided a manufacturing method of manufacturing a semiconductor device according to the first aspect of the invention, the manufacturing method comprising: forming the base region by use of at least a first impurity of the second conduction type which serves to generate an impurity level with a predetermined depth from the edge of the band gap of a base semiconductor material of the semiconductor device while the free carrier density is smaller than the space charge density by a predetermined value, and a second impurity of the second conduction type which serves to generate an impurity level with a depth from the edge of the band gap of the base semiconductor material shallower than the predetermined depth of the first impurity.

According to a sixth aspect of the invention, there is provided a manufacturing method of manufacturing a semiconductor device according to the second aspect of the invention, the manufacturing method comprising: forming the base region; covering the base region with a mask; patterning the mask to form an opening through which part of the base region is exposed; forming the emitter region by doping the base region with an impurity of the first conduction type through the mask; and forming a punch-through stop region by doping the base region with a first impurity of a second conduction type which serves to generate an impurity level with a predetermined depth from the edge of the band gap of a base semiconductor material of the semiconductor device while the free carrier density is smaller than the space charge density by a predetermined value.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DESCRIPTION OF THE PREFERRED EMBODIMENTS

Preferred embodiments in accordance with the invention will be explained below in conjunction with the accompanied drawings. In the drawings, like reference characters indicate functionally like elements. While 4H-SiC is a representative polytype of silicon carbide (SiC) for use in the following embodiments, other polytypes such as 6H-SiC and 3C-SiC can be used in the same manner.

Also, while the following embodiments of the invention are described with a silicon carbide semiconductor as a base semiconductor material (the embodiments 1 through 5), or with a silicon semiconductor as a base semiconductor material (the embodiment 6), any other semiconductor such as GaAs, Ge, diamond and GaN can be also used as a base semiconductor material for the same purpose of the invention.

Furthermore, in the case of the following embodiments, a collector electrode is always formed on a reverse, tail, or rare side or surface (hereafter called "rare surface") of a semiconductor substrate while an emitter electrode is formed on a front, obverse, or principal side or surface (hereafter called "principal surface") of the semiconductor substrate. However, the invention is applicable also, for example, to the structure wherein a collector electrode is arranged on the principal surface of the semiconductor substrate in the same manner as the emitter electrode to flow an electric current in the lateral direction.

Still further, in the case of the following embodiments, there are formed a collector and an emitter region of n-type, and a base region of p-type. However, the combination of the conduction types is not limited thereto. For example, it is possible to form a collector and an emitter region of p-type, and a base region of n-type.

Embodiment 1

Figure 1:
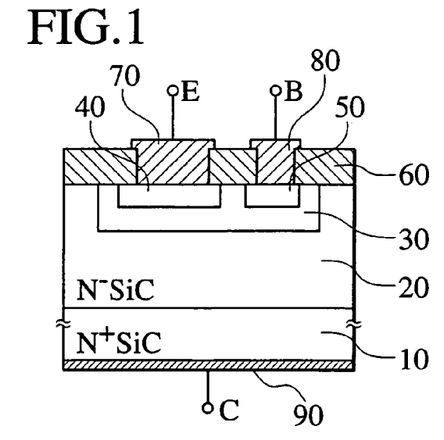
FIG. 1 is a cross sectional view showing the structure of an embodiment 1 of the semiconductor device in accordance with the invention.

FIG. 1 is a cross sectional view showing the structure of an embodiment 1 of the semiconductor device in accordance with the invention.

The present embodiment 1 is applicable to a high voltage SiC semiconductor bipolar transistor in which a p-type base region is formed with boron as a dopant.

The high voltage SiC semiconductor device comprises an $n^-$-type epitaxial layer 20 formed on an $n^+$-type SiC substrate 10 in order to provide a collector region therein and a p-type base region 30 formed within a preselected surface area of the $n^-$-type epitaxial layer 20.

The p-type base region 30 is doped with boron, which serves to generate a deep impurity level in the silicon carbide semiconductor, and has the free carrier density which is smaller than the space charge density of the depletion layer formed in the p-type base region 30 by about two orders of magnitude. In accordance with O. Takemura, T. Kimoto, H. Matsunami, T. Nakata, M. Watanabe and M. Inoue, Materials Science Forum Vols. 264–268 (1998), pp. 701–704, boron serves to generate an impurity level approximately 0.3 eV higher than the top of the valence band of a silicon carbide semiconductor.

The space charge density of the depletion layer extending in the p-type base region 30 is designed larger than the space charge density of the depletion layer extending in the epitaxial layer 20 by one or more orders of magnitude.

The high voltage SiC semiconductor device further comprises an $n^+$-type emitter region 40 and a $p^+$-type base contact region 50 in the predetermined areas of the surface layer of the p-type base region 30. The $n^+$-type emitter region 40 is connected to an emitter electrode 70. Also, the $p^+$-type base contact region 50 is connected to a base electrode 80 while a collector electrode 90 is formed on the rare surface of the $n^+$-type SiC substrate 10. Incidentally, an interlayer insulating film 60 is provided for interlayer insulation and also serves to protect and stabilize the respective surfaces and the junction surfaces.

As described above, the high voltage SiC semiconductor device in accordance with the present embodiment 1 comprises the $n^+$-type SiC substrate 10 on which are provided the collector region in the $n^-$-type epitaxial layer 20, the p-type base region 30 formed on the collector region, the $n^+$-type emitter region 40 formed on the p-type base region 30. Particularly, the free carrier density in the p-type base region 30 when no depletion layer is formed therein is smaller than the space charge density of a depletion layer when it is formed in the p-type base region 30. An n-type and a p-type are sometimes referred respectively to as a first conduction type and a second conduction type in this description.

By this configuration, it is possible to resolve the conventional problem, relating to semiconductor devices, of the tradeoff between the withstanding voltage of a device and the current gain hFE. Namely, while a smaller density of free carriers is desired in order to obtain a high current gain hFE, a larger space charge density of the depletion layer is desired in order to avoid the degradation of the withstanding voltage due to punch-through. The characteristics of the semiconductor device as described above resides in that the free carrier density is different from the space charge density in the base electrode. Particularly, the free carrier density is smaller than the space charge density. The semiconductor device differs greatly from the prior art semiconductor device in this structure. As a result, in accordance with the present embodiment 1, it is possible to realize a high speed switching device which has a low on-resistance and a high withstanding voltage.

Particularly, the free carrier density is smaller than the space charge density within the p-type base region 30 by one or more orders of magnitude. By this configuration, the overall flow of a usual manufacturing process can be used without difficulty to manufacture a silicon carbide semiconductor device in which is improved the tradeoff existing between the withstanding voltage of the device and the current gain hFE.

Furthermore, by use of a silicon carbide semiconductor as a semiconductor substrate, it is possible with ease to secure a high withstanding voltage, a high carrier mobility and a high saturated drift velocity as compared with silicon semiconductors. For this reason, the silicon carbide semiconductor device can be used as a high speed switching device, a high power device and the like.

Next, one example of the manufacturing method of the silicon carbide semiconductor device in accordance with the present embodiment 1 will be explained with reference to the cross sectional views shown in FIGS. 2A to 2E.

Figure 2A:
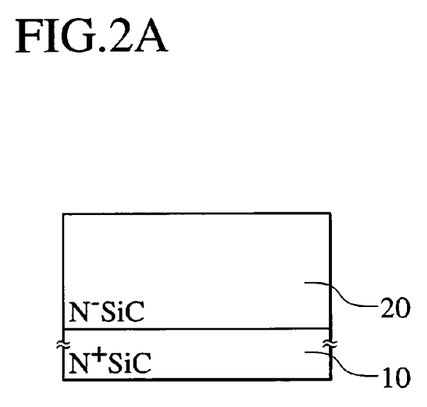
FIGS. 2A to 2E are cross sectional views showing one example of the manufacturing method of the silicon carbide semiconductor device in accordance with the embodiment 1.

First, in the step of FIG. 2A, an n$^-$-type SiC epitaxial layer 20 having a thickness of 1 to 100 μm is formed on an n$^+$-type SiC substrate 10 as a collector region with a dopant concentration of $1 \times 10^{14}$ to $1 \times 10^{18}$ cm$^{-3}$.

Figure 2B:
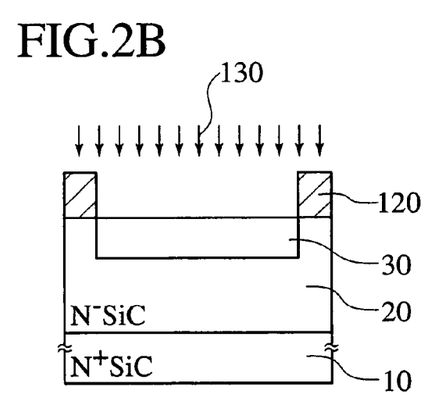

In the step of FIG. 2B, a p-type base region 30 is formed within the n$^-$-type SiC epitaxial layer 20 by injecting boron ions 130 through a mask 120 according to a multi-step ion-implantation with an accelerating voltage of 10 keV to 3 MeV at a high temperature, for example, 100 to 1000° C. The total dose amount is for example $10^{12}$ to $10^{16}$ cm$^{-2}$.

Figure 2C:
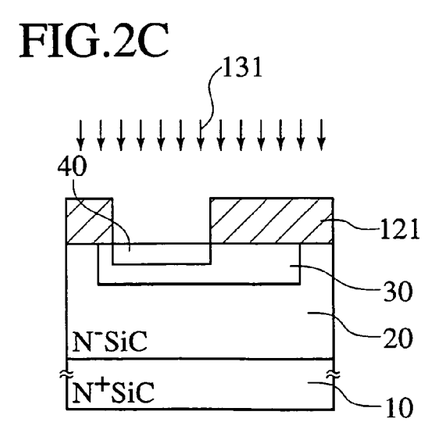

In the step of FIG. 2C, an n$^+$-type emitter region 40 is formed within the p-type base region 30 by injecting thereto phosphor ions 131 through a mask 121 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$. Needless to say, besides phosphorus, nitrogen, arsenicum and the like can be used as an n-type impurity.

Figure 2D:
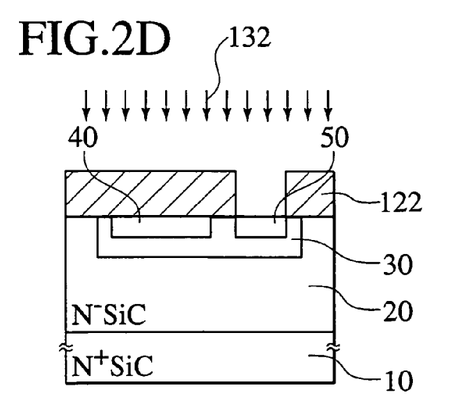

In the step of FIG. 2D, a p$^+$-type base contact region 50 is formed within the p-type base region 30 by injecting thereto aluminum ions 132 through a mask 122 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$.

Incidentally, the p$^+$-type base contact region 50 is preferably formed with an impurity which can be used to generate a shallow impurity level in the silicon carbide semiconductor and therefore aluminum is used for this purpose in the present embodiment 1. In accordance with O. Takemura, T. Kimoto, H. Matsunami, T. Nakata, M. Watanabe and M. Inoue, Materials Science Forum Vols. 264–268 (1998), pp. 701–704, aluminum serves to generate an impurity level 0.2 eV higher than the top of the valence band.

Also, needless to say, the sequential order of the above ion-implantation steps of forming the respective regions can be changed so that, for example, phosphor ions can be first implanted for forming the n$^+$-type emitter region 40.

Figure 2E:
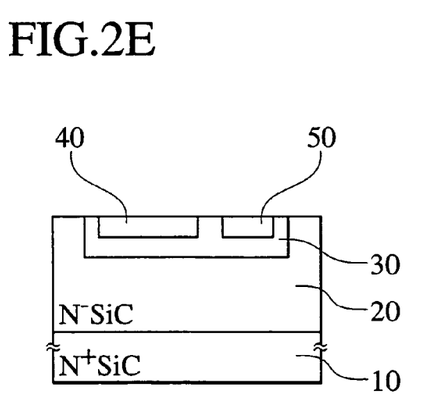

In the step of FIG. 2F, a thermal treatment is given to the silicon carbide semiconductor, for example, at 1000 to 1800° C. in order to move impurity ions in the lattice positions of the silicon carbide semiconductor.

Thereafter, not shown in the figure, after forming a CVD oxide film on the silicon carbide semiconductor as the interlayer film 60, contact holes are opened through the CVD oxide film over the n$^+$-type emitter region 40 and the p$^+$-type base contact region 50 followed by forming the emitter electrode 70 and the base electrode 80 respectively in the contact holes to contact the n$^+$-type emitter region 40 and the p$^+$-type base contact region 50 respectively. A metal film is then formed on the rare surface of the n$^+$-type SiC substrate 10 by evaporation and given thermal treatment, for example, at 600 to 1400° C. to be the collector electrode 90 an ohmic electrode. The silicon carbide semiconductor device as illustrated in FIG. 1 is then completed in accordance with the embodiment 1.

The silicon carbide semiconductor device in accordance with the present embodiment 1 operates with the emitter electrode 70 being connected to ground and the collector electrode 90 being connected to a positive voltage Vc.

In this operating condition, when no voltage is applied to the base electrode 80, the device has reverse bias characteristics of the PN diode between the p-type base region 30 and the n$^-$-type SiC epitaxial layer 20.

In this case, while a depletion layer is formed extending in the epitaxial layer 20 in accordance with the collector voltage Vc, the depletion layer very little extends in the p-type base region 30. This is because the space charge density of the depletion layer extending in the p-type base region 30 is designed larger than the space charge density of the depletion layer extending in the epitaxial layer 20 by one or more orders of magnitude as described above. The depletion layer extending in the p-type base region 30 will be explained later in detail.

Hence, the current from the collector electrode 90 to the emitter electrode 70 starts rapidly increasing only after the collector voltage Vc reaches the breakdown voltage Vb, but the depletion layer in the p-type base region 30 shall not extend to reach the n$^+$-type emitter region 40 to cause punch-through in advance of the breakdown.

On the other hand, when a positive voltage is applied to the base electrode 80 with a voltage applied across the collector and the emitter, positive holes are injected from the base electrode 80 into the p-type base region 30 (a base current starts flowing). At the same time, a large amount of electrons move from the n$^+$-type emitter region 40 to the p-type base region 30.

If the free carrier density in the p-type base region 30 is large, positive holes are excessively injected from the p-type base region 30 into the emitter region 40 and therefore the emitter injection efficiency decreases. Furthermore, if the free carrier density in the p-type base region 30 is large, a number of electrons are recombined with positive holes in the p-type base region 30 and therefore a smaller number of electrons reaches to the epitaxial layer 20.

The present semiconductor device is formed with the p-type base region 30 doped with boron as described above, and therefore characterized in that the free carrier density thereof at room temperature is smaller than the space charge density of the depletion layer formed in the p-type base region 30 by about two orders of magnitude. For this reason, even if the space charge density of the depletion layer formed in the p-type base region 30 is so large as to avoid punch-through, the free carrier density is smaller than the space charge density of the depletion layer at room temperature by about two orders of magnitude.

As a result, a small number of the positive holes are injected from the p-type base region 30 to the emitter region 40 to increase the emitter injection efficiency, whereas a majority of electrons transported to the p-type base region 30 are passed to reach the n⁻-type epitaxial layer 20.

The majority of electrons are then absorbed into the epitaxial layer 20 in the electric field induced by the collector voltage and passed through the collector electrode 90 as the collector current.

In the silicon carbide semiconductor device in accordance with the invention, as described above, the current passed between the collector electrode 90 and the emitter electrode 70 is controlled by adjusting the voltage applied to the base electrode 80 while the collector voltage Vc is limited not to exceed the breakdown voltage Vb. The p-type base region 30 is formed with boron as a dopant which can be used to generate a deep impurity level within the silicon carbide semiconductor and therefore the tradeoff made between the withstanding voltage and the current gain hFE is improved to provide a high speed switching device, which has a low on-resistance and a high withstanding voltage in a simple structure.

With a test device manufactured in accordance with the silicon carbide semiconductor device of this embodiment 1, very high current gains hFE were measured as about 450 at the maximum. Also, the withstanding voltages were about 450 V.

The manufacturing method in accordance with the present embodiment 1 therefore includes at least the step of forming a p-type base region 30 by use of a first impurity of a second conduction type, that is p-type in this case, which serves to generate an impurity level with a predetermined depth from the edge of the band gap of the base semiconductor material (silicon carbide semiconductor in this case) while the above density of free carriers is smaller than the above space charge density by a predetermined value. By this configuration, it is possible to produce a high speed switching device, which has a low on-resistance, a high withstanding voltage and a high current gain hFE without fear of causing punch-through, by the overall flow of a usual manufacturing process without substantial modification.

Particularly, it is an experimental fact that, in the case of a p-type base region formed with the first impurity, the free carrier density is smaller than the space charge density of the depletion layer formed in the p-type base region. If the first impurity is an impurity which is used to generate an impurity level so deep as not to release carriers even at a high temperature (for example, 300° C.), the emitter injection efficiency is sufficiently large even at the high temperature to maintain a high current gain hFE.

Also, since the semiconductor substrate is made of a silicon carbide semiconductor, it is possible to secure a high withstanding voltage, a high carrier mobility and a high saturated drift velocity as compared with silicon semiconductors. For this reason, the semiconductor device can be used as a high speed switching device, a high power device and the like.

Also, the above first impurity is such an impurity which can be used to generate an impurity level apart from the edge of the band gap of the silicon carbide semiconductor substrate by more than 250 meV. It is an experimental fact that, in this condition, the free carrier density at room temperature is certainly smaller than a tenth of the space charge density thereof. Because of this, in accordance with the above configuration, it becomes easy to design and manufacture a silicon carbide semiconductor device while the tradeoff made between the withstanding voltage and the current gain hFE is improved.

Also, since boron which is a typical semiconductor impurity can be used as the first impurity, the manufacturing process can be easily designed. Furthermore, it is an experimental fact that the free carrier density becomes smaller than the space charge density by about two orders of magnitude by use of boron as the first impurity, which is effective to improve the tradeoff made between the withstanding voltage and the current gain hFE of the silicon carbide semiconductor device.

Next, the improvement of tradeoff between the withstanding voltage and the current gain hFE of the silicon carbide semiconductor device in accordance with the present embodiment 1 will be explained in more detail.

The following is a description of the space charge density and the free carrier density in a depletion layer formed in an impurity region doped with an impurity which serves to generate a deep impurity level.

If NA is the space charge density of a depletion layer formed in the p-type base region 30, the density NA⁻ of free carriers is calculated by the following equation (1)

$$NA^- = NA[1 + g \cdot \exp\{q(EA - EFp)/kT\}]^{-1} \quad (1)$$

where EFp is the Fermi level of the p-type base region 30; EA is the impurity level; g is a degeneracy factor (4 is assigned thereto for the p-type semiconductor); k is the Boltzmann constant; and T is an absolute temperature.

In the case of the silicon carbide semiconductor device according to the present embodiment 1, the p-type base region 30 is formed by use of boron which serves to generate a deep impurity level (approximately 0.3 eV higher than the top of the valence band). When the space charge density NA of the p-type base region 30 is for example $5 \times 10^{17}$ cm⁻³, the density NA⁻ of free carriers is $6 \times 10^{15}$ cm⁻³ at room temperature in accordance with the equation (1). This density NA⁻ of free carriers is smaller than the space charge density NA by about two orders of magnitude.

Furthermore, in accordance with the experimental results the inventors actually conducted, when the space charge density NA of the p-type base region doped with boron was $5 \times 10^{17}$ cm⁻³, the free carrier density was measured to be about $2 \times 10^{15}$ cm⁻³ by Hall effect measurement.

As described above, from the theoretical and experimental results, it is understood that, when an impurity region is formed by doping a semiconductor with an impurity serving to generate a deep impurity level, the free carrier density of the impurity region is substantially smaller than the space charge density of a depletion layer formed in the impurity region. Particularly, it is apparent that when an impurity region is formed by doping a silicon carbide semiconductor with boron, the free carrier density of the impurity region is smaller than the space charge density of a depletion layer by about two orders of magnitude. This fact is applied to the present semiconductor device to improve the tradeoff between the withstanding voltage and the current gain hFE of the semiconductor device.

Next, it is explained that the present semiconductor device is a high withstanding voltage device in which punch-through does not occur. For example, it is assumed that the space charge density of a depletion layer extending in the p-type base region 30 is NA=$5 \times 10^{17}$ cm$^{-3}$. It is also assumed that the space charge density ND of a depletion layer extending in the epitaxial layer 20 is $5 \times 10^{15}$ cm$^{-3}$, which is smaller than the space charge density NA by about two orders of magnitude.

In this case, when an electric field is applied to the junction between the epitaxial layer 20 and the p-type base region 30, the width WD of the depletion layer extending in the epitaxial layer 20 and the width WA of the depletion layer extending in the p-type base region 30 satisfy the respective equation (2)

$$NA/ND=WD/WA \qquad (2).$$

The width WA is a hundredth of the width WD so that the depletion layer between the epitaxial layer 20 and the p-type base region 30 has little extension in the p-type base region 30, i.e., 1/100 as compared with the extension in the epitaxial layer 20. As a result, in the case of the present embodiment 1, the depletion layer cannot extend in the p-type base region 30 to reach the emitter region 40 causing punch-through. The withstanding voltage is determined by the reverse bias characteristics of the PN diode composed of the p-type base region 30 and the n$^-$-type epitaxial layer 20, and therefore the withstanding voltage of the device is high.

Finally, it is explained how to achieve the high current gain hFE of the present semiconductor device without compromising the high withstanding voltage which inhibits punch-through.

In order to obtain a high current gain hFE of such a bipolar transistor as the present embodiment 1, the free carrier density in the p-type base region 30 has to be decreased as low as possible. This is because the emitter injection efficiency is raised by decreasing the free carrier density so that electrons are less likely to recombine with holes in the p-type base region.

In accordance with the present embodiment, even when the space charge density NA of the depletion layer extending in the p-type base region 30 is increased to $5 \times 10^{17}$ cm$^{-3}$ in order not to cause punch-through, the free carrier density NA$^-$ is limited to $6 \times 10^{15}$ cm$^{-3}$ which is smaller than the space charge density NA by about two orders of magnitude. Because of this, the present silicon carbide semiconductor device has a high emitter injection efficiency and a low recombination probability of electrons in the p-type base region, and therefore a high current gain hFE is obtained. The current gain hFE was measured to be very high, for example, 450 at the maximum as described above in conjunction with the experimental results.

When measuring the current gain hFE of a prototype silicon carbide bipolar transistor the inventors made, the current gain hFE showed a tendency to decrease as the temperature increased, for example, as fFE=450 at room temperature, fFE=140 at 50° C. and fFE=40 at 100° C. and so forth. This is because, as the temperature increases, the free carrier density increases, the emitter injection efficiency decreases, and the recombination of electrons in the p-type base region increases. This in turn means that the bipolar transistor in accordance with the present embodiment is thermally stable.

The following is a description that, when the free carrier density in the p-type base region 30 is smaller than the space charge density of the depletion layer formed in the p-type base region 30 by one or more orders of magnitude, it is easy to realize a silicon carbide semiconductor device by making use of the overall flow of a usual manufacturing process without difficulty while improving the tradeoff between the withstanding voltage and the current gain hFE.

In the structure of the semiconductor device in accordance with the present embodiment 1, due to the process restrictions, the base length is usually designed to be 1 μm, for example, from 0.1 μm to 2 μm (which is the distance in the p-type base region from the emitter region 40 to the junction surface between the epitaxial layer 20 and the p-type base region 30). If the base length is smaller than this, sophisticated process control is needed in the steps of diffusion, ion-implantation, epitaxial growth and so forth.

Also, taking into consideration the current gain hFE and the conductivity modulation, the space charge density ND of the depletion layer formed in the epitaxial layer 20 is designed usually of the order of $1 \times 10^{15}$ cm$^{-3}$.

In order to realize a high withstanding voltage device, a depletion layer has to sufficiently extend in the epitaxial layer 20, such as WD=10 μm, to prevent punch-through when an electric field is applied to the junction between the p-type base region 30 and the epitaxial layer 20. For this purpose, if WA=1 μm in the equation (2) corresponding to the base length of 1 μm, for example, the space charge density NA of the depletion layer formed in the p-type base region 30 has to be larger than the space charge density ND of the depletion layer formed in the epitaxial layer 20 by one order of magnitude, i.e., of the order of $1 \times 10^{16}$ cm$^{-3}$.

On the other hand, in order to achieve a large emitter injection efficiency, the free carrier density NA$^-$ in the p-type base region 30 has to be smaller than the space charge density NA of the depletion layer formed in the p-type base region 30 by one order of magnitude, i.e., of the order of $1 \times 10^{15}$ cm$^{-3}$.

Conversely, by satisfying the requirement that the free carrier density is smaller than the space charge density by one or more orders of magnitude, it is possible to let a depletion layer extend in the epitaxial layer 20 for 10 μm with a base length of 1 μm, and then realize a silicon carbide semiconductor device having a high current gain hFE and a high emitter injection efficiency.

If an impurity level is generated apart from the edge of the band gap of the silicon carbide semiconductor substrate by more than 250 meV, in accordance with the equation (1), it is possible to satisfy the requirement that the free carrier density at room temperature is smaller than the space charge density by one or more orders of magnitude.

Incidentally, although not used in the present embodiment 1, Ga (gallium), In (indium), Tl (thalium) and the like can be used in place of boron for the purpose of generating an impurity level apart from the edge of the band gap of the silicon carbide semiconductor substrate by more than 250 meV.

Also, while the n$^+$-type emitter region 40 and the p$^+$-type base contact region 50 are formed in the surface layer of the p-type base region 30 in the case of the power bipolar transistor according to the embodiment 1 as illustrated in FIG. 1, the p$^+$-type base contact region 50 can be dispensed with by forming the base electrode 80 as an ohmic electrode which is in direct contact with the p-type base region 30.

Embodiment 2

Figure 3:
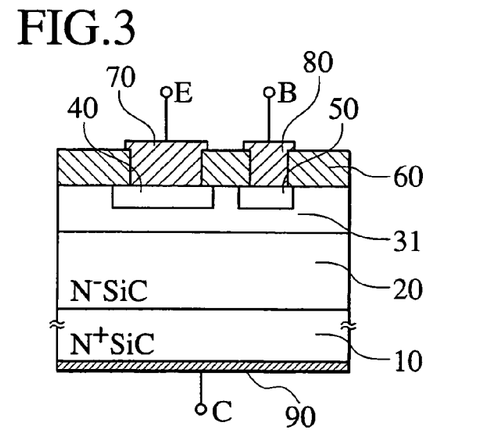
FIG. 3 is a cross sectional view showing the structure of an embodiment 2 of the semiconductor device in accordance with the invention.

FIG. 3 is a cross sectional view showing the structure of an embodiment 2 of the semiconductor device in accordance with the invention.

The present embodiment 2 is applicable to a high voltage SiC semiconductor bipolar transistor in which a p-type base region is formed with boron as a dopant.

The high voltage SiC semiconductor device comprises an $n^-$-type epitaxial layer 20 formed on an $n^+$-type SiC substrate 10 in order to provide a collector region therein, and an epitaxial layer which is formed on the $n^-$-type epitaxial layer 20 in order to provide a p-type base region 31.

The high voltage SiC semiconductor device further comprises an $n^+$-type emitter region 40 and a $p^+$-type base contact region 50 in the predetermined areas of the surface layer of the p-type base region 31. The $n^+$-type emitter region 40 is connected to an emitter electrode 70. Also, the $p^+$-type base contact region 50 is connected to a base electrode 80 while a collector electrode 90 is formed on the rare surface of the $n^+$-type SiC substrate 10. Incidentally, an interlayer insulating film 60 is provided for interlayer insulation and also serves to protect and stabilize the respective surfaces and the junction surfaces.

The difference of the present embodiment 2 from the embodiment 1 as illustrated in FIG. 1 resides in that the p-type base region 31 is not formed by ion-implantation but is formed by epitaxial growth with a predetermined impurity as a dopant. Because of this, there are a very small number of lattice defects in the p-type base region 31 and in the vicinity of the junction interface between the p-type base region 31 and the epitaxial layer 20, so that there is a further advantage, in the case of the present embodiment 2, that the withstanding voltage and the current gain hFE are furthermore improved as compared with the embodiment 1.

Next, one example of the manufacturing method of the silicon carbide semiconductor device in accordance with the present embodiment 2 will be explained with reference to the cross sectional views shown in FIGS. 4A to 4E.

Figure 4A:
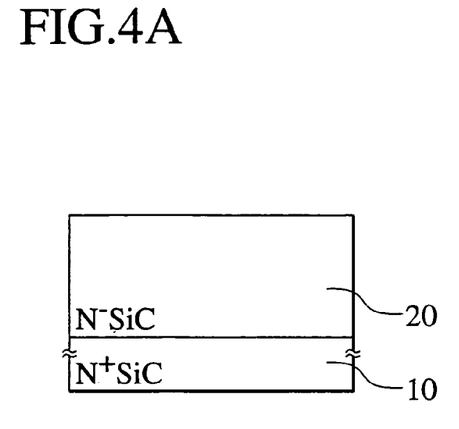
FIGS. 4A to 4E are cross sectional views showing one example of the manufacturing method of the silicon carbide semiconductor device in accordance with the embodiment 2.

First, in the step of FIG. 4A, an $n^-$-type SiC epitaxial layer 20 having a thickness of 1 to 100 µm is formed on an $n^+$-type SiC substrate 10 as a collector region with a dopant concentration of $1\times10^{14}$ to $1\times10^{18}$ cm$^{-3}$.

Figures 4B, 4E:
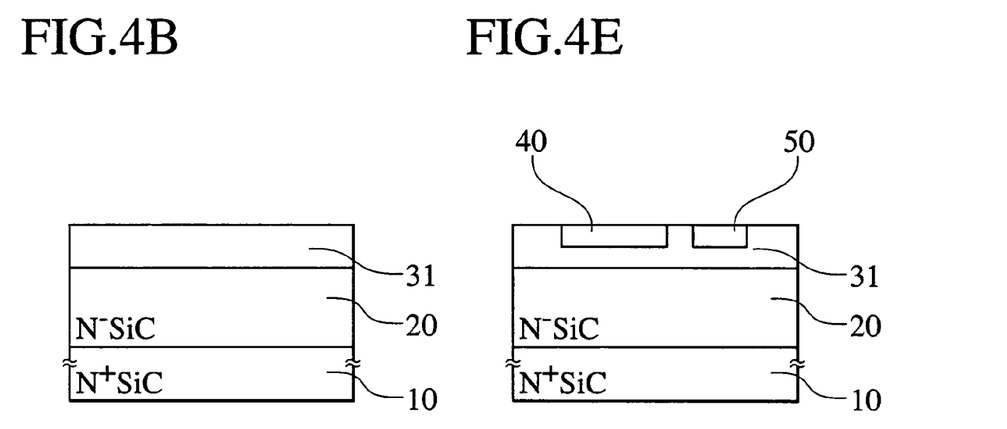

In the step of FIG. 4B, a p-type base region 31 is formed with a dopant concentration of $1\times10^{14}$ to $1\times10^{18}$ cm$^{-3}$ on the $n^{31}$-type SiC epitaxial layer 20 by epitaxial growth to a thickness of 0.1 to 10 µm. The raw material gas is for example $SiH_4$ and $C_3H_8$. During the epitaxial growth process, a dopant gas such as $B_2H_6$ is used together therewith.

Incidentally, Ga (gallium), In (indium), Tl (thalium) and the like can be used in place of boron for the purpose of generating a deep impurity level in the silicon carbide semiconductor, and therefore one of these impurities can also be used as a dopant, in the form of an appropriate dopant gas, for doping the epitaxial layer during its epitaxial growth.

Figure 4C:
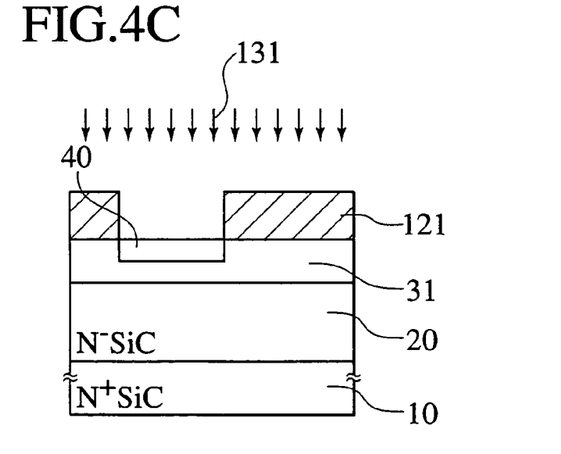

In the step of FIG. 4C, an $n^+$-type emitter region 40 is formed within the p-type base region 31 by injecting phosphor ions 131 through a mask 121 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$. Needless to say, besides phosphorus, nitrogen, arsenicum and the like can be used as an n-type impurity.

Figure 4D:
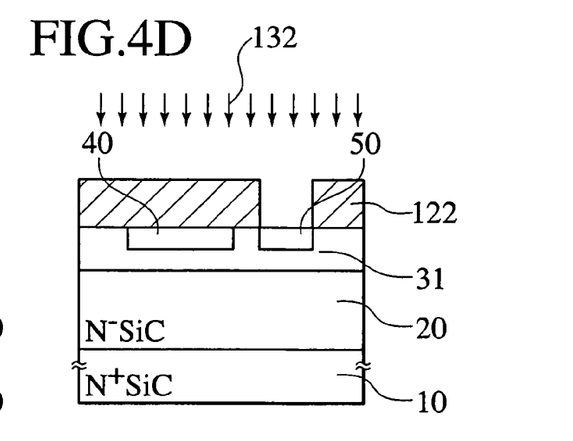

In the step of FIG. 4D, a $p^+$-type base contact region 50 is formed within the p-type base region 31 by injecting aluminum ions 132 through a mask 122 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$.

Incidentally, the $p^+$-type base contact region 50 is preferably formed with an impurity which can be used to generate a shallow impurity level in a silicon carbide semiconductor and therefore aluminum is used for this purpose in the present embodiment 2.

Also, needless to say, the sequential order of the above ion-implantation steps of forming the respective regions can be changed so that aluminum ions can be first implanted for forming the $p^+$-type base contact region 50.

In the step of FIG. 4E, a thermal treatment is given to the silicon carbide semiconductor, for example, at 1000 to 1800° C. in order to move impurity ions in the lattice positions of the silicon carbide semiconductor.

Thereafter, not shown in the figure, after forming a CVD oxide film on the silicon carbide semiconductor as the interlayer film 60, contact holes are opened through the CVD oxide film over the $n^+$-type emitter region 40 and the $p^+$-type base contact region 50, followed by forming the emitter electrode 70 and the base electrode 80 in contact with the $n^+$-type emitter region 40 and the $p^+$-type base contact region 50 respectively through the contact holes. A metal film is then formed on the rare surface of the $n^+$-type SiC substrate 10 by evaporation and given thermal treatment, for example, at 600 to 1400° C. to be the collector electrode 90 an ohmic electrode. The silicon carbide semiconductor device as illustrated in FIG. 3 is then completed in accordance with the embodiment 2.

As described above, in the case of the manufacturing method according to the present embodiment 2, the p-type base region 31 is formed by semiconductor epitaxial growth for example with boron as a dopant. Accordingly, it is possible to form the junction interface between the base region and the collector region by semiconductor epitaxial growth and therefore to decrease the number of lattice defects existing in the base region and the junction interface between the base region and the collector region. Because of this, the withstanding voltage and the current gain hFE of the semiconductor device are furthermore increased.

Embodiment 3

Figure 5:
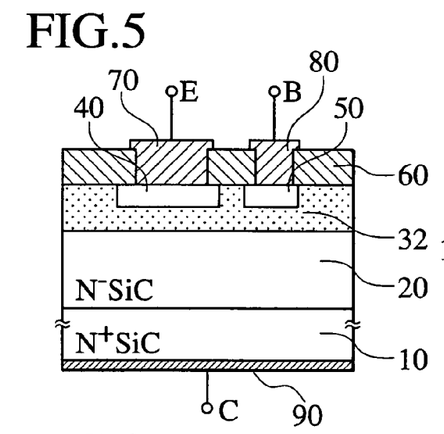
FIG. 5 is a cross sectional view showing the structure of an embodiment 3 of the semiconductor device in accordance with the invention.

FIG. 5 is a cross sectional view showing the structure of an embodiment 3 of the silicon carbide semiconductor device in accordance with the invention.

The present embodiment 3 is applicable to an SiC high voltage bipolar transistor in which a p-type base region is formed with boron and aluminum as dopants.

The SiC high voltage bipolar transistor comprises an $n^-$-type epitaxial layer 20 formed on an $n^+$-type SiC substrate 10 in order to provide a collector region therein, and an epitaxial layer which is formed on the $n^-$-type epitaxial layer 20 in order to provide a p-type base region 32.

This p-type base region 32 is formed by epitaxial growth with an impurity (boron in this case) which serves to generate a deep impurity level to form the epitaxial layer to be a p-type region, followed by ion-implantation with an impurity (aluminum in this case) which serves to generate a shallow impurity level into the entirety of the p-type region.

The high voltage SiC semiconductor device further comprises an $n^+$-type emitter region 40 and a $p^+$-type base contact region 50 in the predetermined areas of the surface layer of the p-type base region 32. The $n^+$-type emitter region 40 is connected to an emitter electrode 70. Also, the p+-type base contact region 50 is connected to a base electrode 80 while a collector electrode 90 is formed on the rare surface of the n+-type SiC substrate 10. Incidentally, an interlayer insulating film 60 is provided for interlayer insulation and also serves to protect and stabilize the respective surfaces and the junction surfaces.

The difference of the present embodiment 3 from the embodiment 2 as illustrated in FIG. 3 resides in that an impurity (aluminum in this case) which serves to generate a shallow impurity level is ion-implanted into the entirety of the p-type base region 32 formed on the n−-type epitaxial layer 20 by epitaxial growth with an impurity (boron in this case) which serves to generate a deep impurity level.

In the case of the embodiment 2, the depth of the impurity level generated by the impurity as used limits the free carrier density in the p-type base region 31 and the space charge density of the depletion layer formed in the p-type base region 31. That is, when the space charge density is determined, the free carrier density is then automatically determined by the space charge density.

However, in the case of the present embodiment 3, it is possible by making use of at least two impurities to determine the space charge density and the free carrier density independent from each other. Namely, while the space charge density of the depletion layer formed in the p-type base region 32 is determined by an impurity which serves to generate a deep impurity level, the free carrier density in the p-type base region 32 is determined by an impurity which serves to generate a shallow impurity level. In other words, the space charge density and the free carrier density can be freely selected separate independent from each other. For this reason, it is possible to furthermore improve the tradeoff between the withstanding voltage and the current gain as compared with the embodiment 2.

Particularly, if the impurity which serves to generate a deep impurity level is an impurity which is used to generate an impurity level so deep, for example 0.7 eV apart from the valence band edge, as not to generate carriers even at a high temperature (for example, 300° C.), the emitter injection efficiency is sufficiently large even at the high temperature to maintain a high current gain hFE.

Next, one example of the manufacturing method of the silicon carbide semiconductor device in accordance with the present embodiment 3 will be explained with reference to the cross sectional views shown in FIGS. 6A to 6F.

Figure 6A:
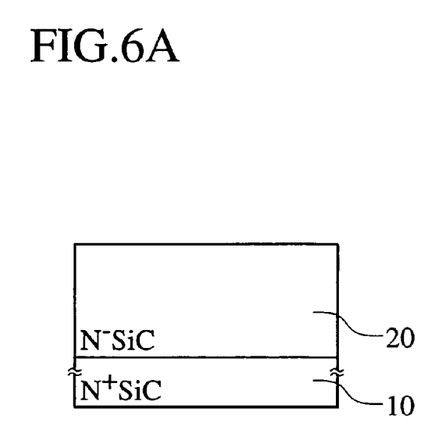
FIGS. 6A to 6F are cross sectional views showing one example of the manufacturing method of the silicon carbide semiconductor device in accordance with the embodiment 3.

First, in the step of FIG. 6A, an n−-type SiC epitaxial layer 20 having a thickness of 1 to 100 82 m is formed on an n+-type SiC substrate 10 as a collector region with a dopant concentration of $1 \times 10^{14}$ to $1 \times 10^{18}$ cm$^{-3}$.

Figure 6B:
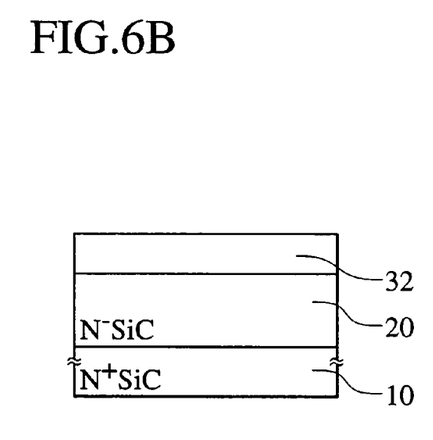

In the step of FIG. 6B, a p-type base region 32 is formed with a dopant concentration of $1 \times 10^{14}$ to $1 \times 10^{18}$ cm$^{-3}$ on the n−-type SiC epitaxial layer 20 by epitaxial growth to a thickness of 0.1 to 10 μm. The raw material gas is for example $SiH_4$ and $C_3H_8$. During the epitaxial growth process, a dopant gas such as $B_2H_6$ is used together therewith.

Incidentally, Ga (gallium), In (indium), Tl (thalium) and the like can be used in place of boron for the purpose of generating a deep impurity level in the silicon carbide semiconductor, and therefore one of these impurities can also be used as a dopant, in the form of an appropriate dopant gas, for doping the epitaxial layer during its epitaxial growth.

Figure 6C:
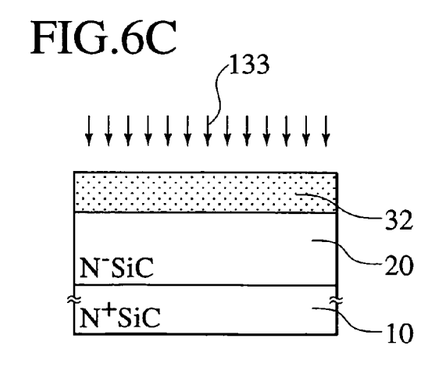

In the step of FIG. 6C, aluminum ions 133 are implanted in the p-type base region 32 of the epitaxial layer at a high temperature, for example, 100 to 1000° C. with an accelerating voltage of 10 keV to 3 MeV. The total dose amount is for example $10^{10}$ to $10^{13}$ cm$^{-2}$.

Figure 6D:
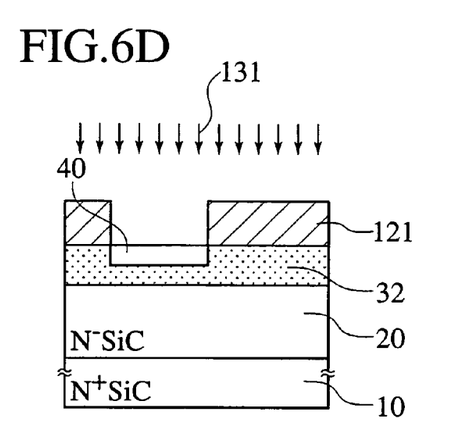

In the step of FIG. 6D, an n+-type emitter region 40 is formed within the p-type base region 32 by injecting phosphor ions 131 through a mask 121 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$. Needless to say, besides phosphorus, nitrogen, arsenicum and the like can be used as an n-type impurity.

Figure 6E:
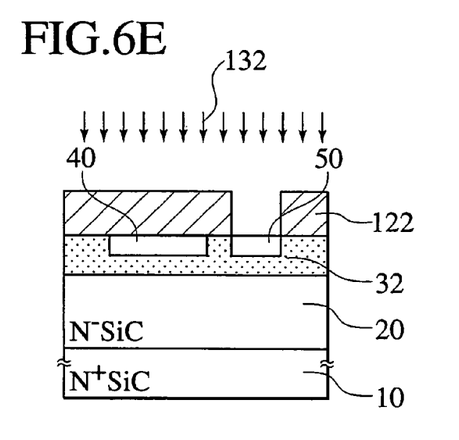

In the step of FIG. 6E, a p+-type base contact region 50 is formed within the p-type base region 32 by injecting aluminum ions 132 through a mask 122 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$.

Incidentally, the p+-type base contact region 50 is preferably formed with an impurity which can be used to generate a shallow impurity level in a silicon carbide semiconductor and therefore aluminum is used for this purpose in the present embodiment 3.

Also, needless to say, the sequential order of the above ion-implantation steps of forming the respective regions can be changed so that aluminum ions can be first implanted for forming the p+-type base contact region 50.

Figure 6F:
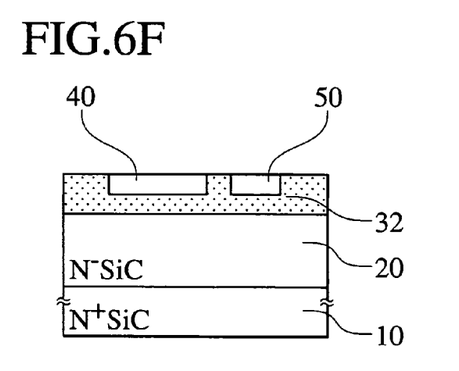

In the step of FIG. 6F, a thermal treatment is given to the silicon carbide semiconductor, for example, at 1000 to 1800° C. in order to move impurity ions in the lattice positions of the silicon carbide semiconductor.

Thereafter, not shown in the figure, after forming a CVD oxide film on the silicon carbide semiconductor as the interlayer film 60, contact holes are opened through the CVD oxide film over the n+-type emitter region 40 and the p+-type base contact region 50, followed by forming the emitter electrode 70 and the base electrode 80 in contact with the n+-type emitter region 40 and the p+-type base contact region 50 respectively through the contact holes. A metal film is then formed on the rare surface of the n+-type SiC substrate 10 by evaporation and given thermal treatment, for example, at 600 to 1400° C. to be the collector electrode 90 an ohmic electrode. The silicon carbide semiconductor device as illustrated in FIG. 5 is then completed in accordance with the embodiment 3.

While the p-type base region 32 is formed by epitaxial growth with an impurity serving to generate a deep impurity level followed by ion-implantation with a shallow impurity level in accordance with the present embodiment 3, both a deep impurity level and a shallow impurity level are formed by ion-implantation of the respective impurities to form the p-type base region.

As described above, in the case of the manufacturing method according to the present embodiment 3, the p-type base region 32 is formed by use of at least two impurities, i.e. a first impurity of a second conduction type which serves to generate an impurity level with a predetermined depth from the edge of the band gap of the base semiconductor material while the above density of free carriers is smaller than the above space charge density by a predetermined value, and a second impurity of the second conduction type which serves to generate an impurity level with a depth from the edge of the band gap of the base semiconductor material shallower than the predetermined depth of the first impurity. It is therefore possible to determine the space charge density of the base region by use of the first impurity and determine the free carrier density of the base region by use of the second impurity. As a result, while the free carrier density is determined by the depth of an impurity level generated by the first impurity when the space charge density is determined in accordance with the manufacturing method of the embodiment 1, the free carrier density and the space charge density can be independently determined in accordance with the present embodiment. Accordingly, it is possible to furthermore improve the tradeoff between the withstanding voltage and the current gain as compared with the embodiment 1.

Namely, in accordance with the present embodiment 3, an impurity level is formed by the second impurity at a position shallower than the position 250 meV apart from the edge of the band gap. The difference between the free carrier density and the space charge density in the case of the second impurity is small and therefore a necessary density of free carriers can be obtained by a small dose amount to make it easy to control the free carrier density.

Furthermore, in accordance with the present embodiment 3, since aluminum which is a typical semiconductor impurity can be used, the manufacturing process can be designed without difficulty. Still further, since aluminum serves to generate an impurity level 0.2 eV higher than the top of the valence band, the difference between the free carrier density and the space charge density is small and therefore a necessary density of free carriers can be obtained by a small dose amount to make it easy to control the free carrier density.

Embodiment 4

Figure 7:
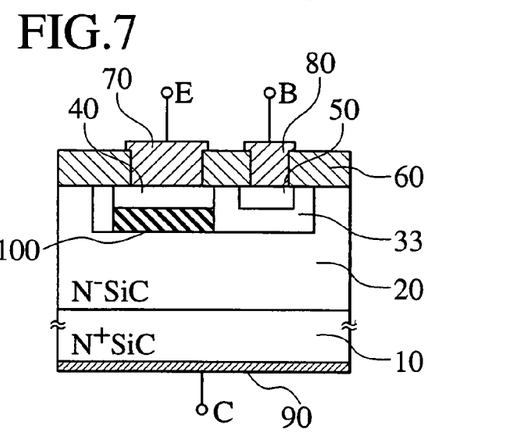
FIG. 7 is a cross sectional view showing the structure of an embodiment 4 of the semiconductor device in accordance with the invention.

FIG. 7 is a cross sectional view showing the structure of an embodiment 4 of the silicon carbide semiconductor device in accordance with the invention.

The present embodiment 4 is applicable to an SiC high voltage bipolar transistor provided with a punch-through stop layer.

The SiC high voltage bipolar transistor comprises an $n^-$-type epitaxial layer 20 formed on an $n^+$-type SiC substrate 10 in order to provide a collector region therein, and a p-type base region 33 formed within a preselected surface area of the $n^-$-type epitaxial layer 20. This p-type base region 33 is formed with aluminum as a dopant which serves to generate a shallow impurity level in the silicon carbide semiconductor.

The high voltage SiC semiconductor device further comprises an $n^+$-type emitter region 40 and a $p^+$-type base contact region 50 in the predetermined areas of the surface layer of the p-type base region 33. The $n^+$-type emitter region 40 is provided with a p-type punch-through stop region 100 just under the $n^+$-type emitter region 40. This p-type punch-through stop region 100 is formed with boron as a dopant which can be used to generate a deep impurity level within the silicon carbide semiconductor and therefore characterized in that the free carrier density thereof at room temperature is smaller than the space charge density of the depletion layer formed in the p-type punch-through stop region 100 by about two orders of magnitude.

Furthermore, the space charge density of the depletion layer extending in the p-type punch-through stop region 100 is designed larger than the space charge density of the depletion layer extending in the epitaxial layer 20 by one or more orders of magnitude as described above.

The $n^+$-type emitter region 40 is connected to an emitter electrode 70. Also, the $p^+$-type base contact region 50 is connected to a base electrode 80 while a collector electrode 90 is formed on the rare surface of the $n^+$-type SiC substrate 10. Incidentally, an interlayer insulating film 60 is provided for interlayer insulation and also serves to protect and stabilize the respective surfaces and the junction surfaces.

The difference of the present embodiment 4 from the embodiment 1 as illustrated in FIG. 1 resides in that the p-type punch-through stop region 100 is formed in the p-type base region 33 just under the $n^+$-type emitter region 40. Another difference resides in that the p-type base region 33 is formed with an impurity, for example aluminum, which serves to generate a shallow impurity level in the silicon carbide semiconductor by ion-implantation.

In this case, the space charge density of the depletion layer extending in the p-type base region 33 is designed larger than the space charge density of the depletion layer extending in the p-type punch-through stop region 100. By this configuration, it is possible not only to prevent punch-through from occurring between the p-type punch-through stop region 100 and the emitter region 40 but also to lessen the electric field concentration at the edge of the p-type punch-through stop region 100 by the depletion layer extending in the p-type base region 33 even if the space charge density extending in the p-type punch-through stop region 100 is increased. Because of this, while there is a problem in the case of the embodiment 1 that an electric field is concentrated to the corner of the p-type base region 30 to decrease the withstanding voltage when the space charge density of the depletion layer extending in the p-type base region 30 is designed high, this problem is solved by the present embodiment 4 to realize a semiconductor device with a higher withstanding voltage.

In the case of the present embodiment 4, the semiconductor substrate comprises the collector region of the $n^-$-type epitaxial layer 20, the p-type base region 33 formed on the collector region, the $n^+$-type emitter region 40 formed on the p-type base region 33, and the p-type punch-through stop region 100 formed within the $n^+$-type emitter region 40 just under the $n^+$-type emitter region 40, wherein the free carrier density of the p-type punch-through stop region 100 where no depletion layer is formed is smaller than the space charge density of a depletion layer formed in the p-type punch-through stop region 100. Accordingly, in the case of the present embodiment 4, the p-type punch-through stop region 100 is formed just under the $n^+$-type emitter region 40 with a high space charge density, and therefore it is possible to prevent punch-through and decrease the space charge density of the base region as compared with the semiconductor device in accordance with the embodiment 1.

Namely, the space charge density of the p-type base region 33 is smaller than the space charge density of the p-type punch-through stop region 100. The smaller space charge density of the base region is effective to lessen the concentration of an electric field to the corner of the p-type punch-through stop region 100 by a depletion layer extending in the base region adjacent to the p-type punch-through stop region 100, and therefore it is possible to manufacture a semiconductor device having a higher withstanding voltage.

The free carrier density of the p-type punch-through stop region 100 is smaller than the space charge density thereof by one or more orders of magnitude. By this configuration, the overall flow of a usual manufacturing process can be used without difficulty to manufacture a silicon carbide semiconductor device in which is improved the tradeoff existing between the withstanding voltage of the device and the current gain hFE.

Next, one example of the manufacturing method of the silicon carbide semiconductor device in accordance with the present embodiment 4 will be explained with reference to the cross sectional views shown in FIGS. 8A to 8F.

Figures 8A, 8D:
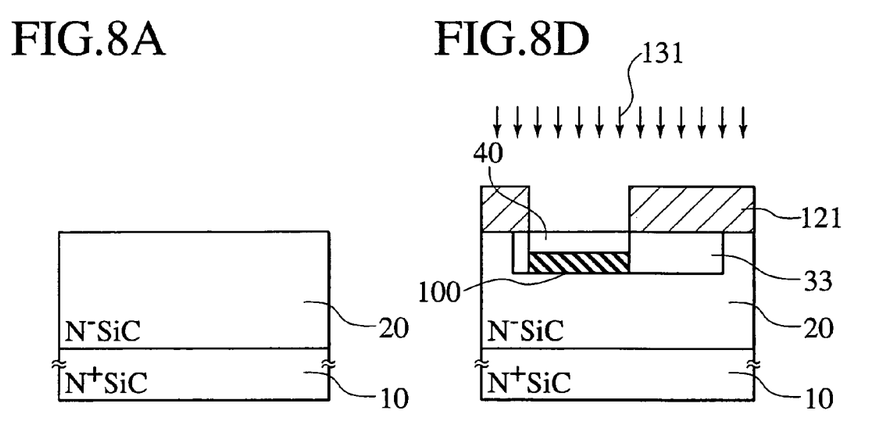
FIGS. 8A to 8F are cross sectional views showing one example of the manufacturing method of the silicon carbide semiconductor device in accordance with the embodiment 4.

First, in the step of FIG. 8A, an n−−type SiC epitaxial layer 20 having a thickness of 1 to 100 μm is formed on an n+-type SiC substrate 10 as a collector region with a dopant concentration of $1 \times 10^{14}$ to $1 \times 10^{18}$ cm$^{-3}$.

Figure 8B:
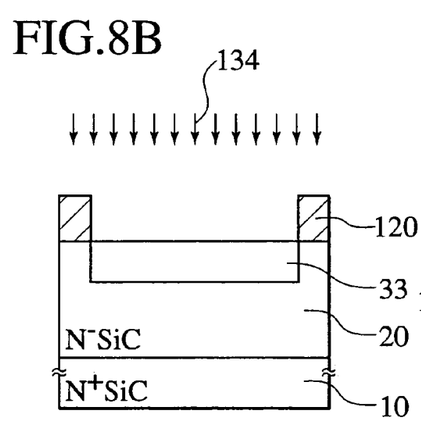

In the step of FIG. 8B, a p-type base region 33 is formed within the n−-type SiC epitaxial layer 20 by injecting aluminum ions 134 through a mask 120 according to a multi-step ion-implantation with an accelerating voltage of 10 keV to 3 MeV at a high temperature, for example, 100 to 1000° C. The total dose amount is for example $10^{12}$ to $10^{15}$ cm$^{-2}$.

In this case, the p-type base region 33 is formed by ion-implantation, preferably with an impurity which can be used to generate a shallow impurity level in the silicon carbide semiconductor and therefore aluminum is used for this purpose in the present embodiment 4. Of course, boron, Ga (gallium), In (indium), Tl (thalium) and the like can be used in place of aluminum for the same purpose, as long as the necessary relationship between the shallow impurity level and the deep impurity level as described above is established, taking into consideration the impurity subsequently used to form a p-type punch-through stop region.

Figure 8C:
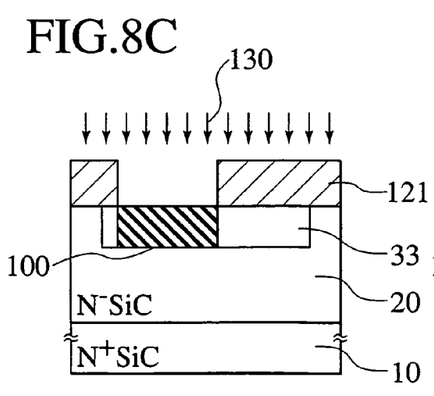

In the step of FIG. 8C, a p-type punch-through stop region 100 is formed within the p-type base region 33 by injecting thereto boron ions 130 through a mask 121 according to a multi-step ion-implantation with an accelerating voltage of 10 keV to 3 MeV at a high temperature, for example, 100 to 1000° C. The total dose amount is for example $10^{12}$ to $10^{16}$ cm$^{-2}$.

Of course, Ga (gallium), In (indium), Tl (thalium) and the like can be used in place of boron, as long as the necessary relationship between the shallow impurity level and the deep impurity level as described above is established, taking into consideration the impurity subsequently used to the p-type base region 33.

In the step of FIG. 8D, an n+-type emitter region 40 is formed by injecting phosphor ions 131 through the same mask 121 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$. Needless to say, besides phosphorus, nitrogen, arsenicum and the like can be used as an n-type impurity.

Figure 8E:
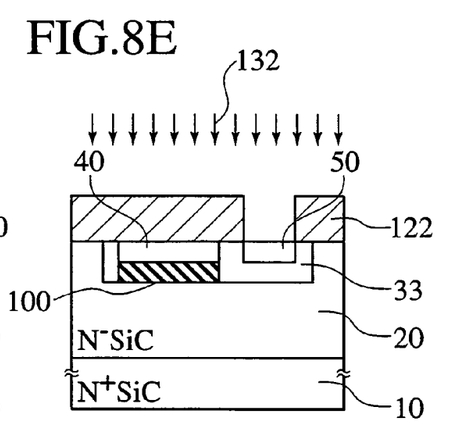

In the step of FIG. 8E, a p+-type base contact region 50 is formed within the p-type base region 33 by injecting thereto aluminum ions 132 through a mask 122 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$.

Incidentally, the p+-type base contact region 50 is preferably formed with an impurity which can be used to generate a shallow impurity level in the silicon carbide semiconductor and therefore aluminum is used for this purpose in the present embodiment.

Also, needless to say, the sequential order of the above ion-implantation steps of forming the respective regions can be changed so that, for example, aluminum ions can be first implanted for forming the p+-type base contact region 50.

Figure 8F:
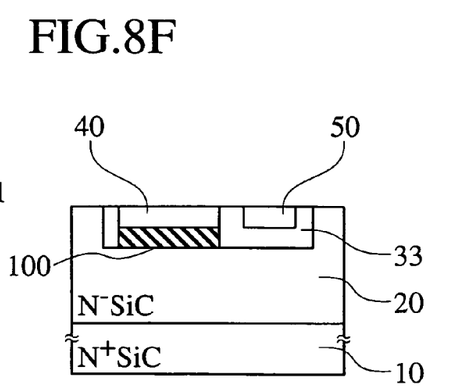

In the step of FIG. 8F, a thermal treatment is given to the silicon carbide semiconductor, for example, at 1000 to 1800° C. in order to move impurity ions in the lattice positions of the silicon carbide semiconductor.

Thereafter, not shown in the figure, after forming a CVD oxide film on the silicon carbide semiconductor as the interlayer film 60, contact holes are opened through the CVD oxide film over the n+-type emitter region 40 and the p+-type base contact region 50 followed by forming the emitter electrode 70 and the base electrode 80 respectively in the contact holes to contact the n+-type emitter region 40 and the p+-type base contact region 50 respectively. A metal film is then formed on the rare surface of the n+-type SiC substrate 10 by evaporation and given thermal treatment, for example, at 600 to 1400° C. to be the collector electrode 90 an ohmic electrode. The silicon carbide semiconductor device as illustrated in FIG. 7 is then completed in accordance with the embodiment 4.

In accordance with the present embodiment 4, as described above, the withstanding voltage is further improved as compared with the embodiment 1. Furthermore, since the emitter region and the punch-through stop region can be formed with the same mask, the manufacturing process is simplified as compared with a usual manufacturing process making use of two masks.

The emitter region and the punch-through stop region can be formed without misalignment and therefore it is possible to surely avoid punch-through.

While the p-type base region 33 is formed by ion-implantation of aluminum in accordance with the present embodiment 4, it can be formed by epitaxial growth with an appropriate dopant gas such as TMA (Al(CH$_3$)$_3$).

As described above, the manufacturing method in accordance with the present embodiment 4 includes a step of forming the p-type base region 33, a step of covering the semiconductor substrate with the mask 121, a step of patterning the mask 121 in order to form an opening through which a surface of the p-type base region 33 is exposed, a step of forming the n+-type emitter region 40 by doping the p-type base region 33 with phosphor ions 131 through the mask 121 as an impurity, and a step of forming the p-type punch-through stop region 100 by doping the p-type base region 33 just under the n+-type emitter region 40 with boron as a first impurity of a second conduction type which serves to generate an impurity level with a predetermined depth from the edge of the band gap of the base semiconductor material while the above density of free carriers is smaller than the above space charge density by a predetermined value. Some steps can be exchanged in any possible order as explained above. For example, either one of the p-type punch-through stop region 100 and the n+-type emitter region 40 can be formed in advance of the other. By this configuration, the n+-type emitter region 40 and the p-type punch-through stop region 100 can be formed with the same mask, the manufacturing process is simplified as compared with a usual manufacturing process making use of two masks. Also, the emitter region and the punch-through stop region can be formed without misalignment and therefore it is possible to surely avoid punch-through in the semiconductor device as manufactured.

Furthermore, the p-type base region 33 is formed with the second impurity of the second conduction type which serves to generate an impurity level with a depth from the edge of the band gap of the base semiconductor material shallower than the depth of an impurity level generated by the first impurity. By this configuration, it is possible to determine the space charge density of the punch-through stop region by use of the first impurity and determine the free carrier density of the base region and the punch-through stop region by use of the second impurity. Because of this, while the free carrier density of the punch-through stop layer is determined by the depth of an impurity level generated by the first impurity when the space charge density of the punch-through stop region is determined in accordance with other manufacturing methods by making use of only one impurity, the free carrier density and the space charge density can be independently determined in accordance with the present embodiment. Accordingly, it is possible to furthermore improve the tradeoff between the withstanding voltage and the current gain as compared with other manufacturing methods by making use of only one impurity.

Incidentally, while the p-type base region 33 is formed by ion-implantation of aluminum ions 134 in the step of FIG. 8B, it is also possible to for the base region by semiconductor epitaxial growth in the same manner as in the embodiment 2. By this configuration, it is possible to form the junction interface between the base region and the collector region by semiconductor epitaxial growth and therefore to decrease the number of lattice defects existing in the base region and the junction interface between the base region and the collector region. The withstanding voltage and the current gain hFE of the semiconductor device are therefore furthermore increased as compared with a semiconductor device having a base region formed by ion-implantation.

Embodiment 5

Figure 9:
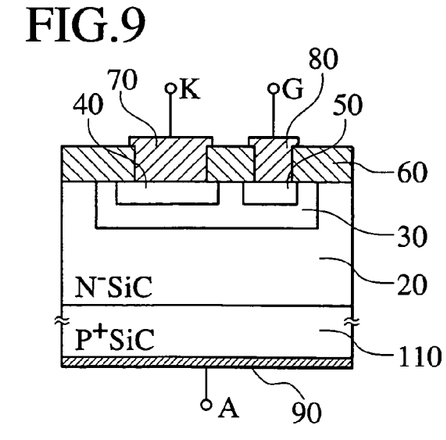
FIG. 9 is a cross sectional view showing the structure of an embodiment 5 of the semiconductor device in accordance with the invention.

FIG. 9 is a cross sectional view showing the structure of an embodiment 5 of the semiconductor device in accordance with the invention. The present embodiment 5 is applicable to an SiC high voltage thyristor. The difference of the present embodiment 5 from the embodiment 1 as illustrated in FIG. 1 resides in that the n$^+$-type SiC substrate 10 is replaced by a p$^+$-type SiC substrate 110 to make the semiconductor device a so-called thyristor The SiC high voltage thyristor comprises an n$^-$-type epitaxial layer 20 formed on the p$^+$-type SiC substrate 110 and a p-type base region 30 formed within a preselected surface area of the n$^-$-type epitaxial layer 20.

The p-type base region 30 is doped with boron, which serves to generate a deep impurity level (impurity level approximately 0.3 eV higher than the top of the valence band) in the silicon carbide semiconductor, and has the free carrier density which is smaller than the space charge density of the depletion layer formed in the p-type base region 30 by about two orders of magnitude.

The space charge density of the depletion layer extending in the p-type base region 30 is designed larger than the space charge density of the depletion layer extending in the epitaxial layer 20 by one or more orders of magnitude.

The high voltage SiC semiconductor device further comprises an n$^+$-type cathode (emitter) region 40 and a p$^+$-type gate (base) contact region 50 in the predetermined areas of the surface layer of the p-type base region 30. The n$^+$-type cathode region 40 is connected to an cathode (emitter) electrode 70. Also, the p$^+$-type gate region 50 is connected to a gate (base) electrode 80 while an anode electrode 90 is formed on the rare surface of the p$^+$-type SiC substrate 110. Incidentally, an interlayer insulating film 60 is provided for interlayer insulation and also serves to protect and stabilize the respective surfaces and the junction surfaces.

Next, one example of the manufacturing method of the silicon carbide semiconductor device in accordance with the present embodiment 5 will be explained with reference to the cross sectional views shown in FIGS. 10A to 10E.

Figure 10A:
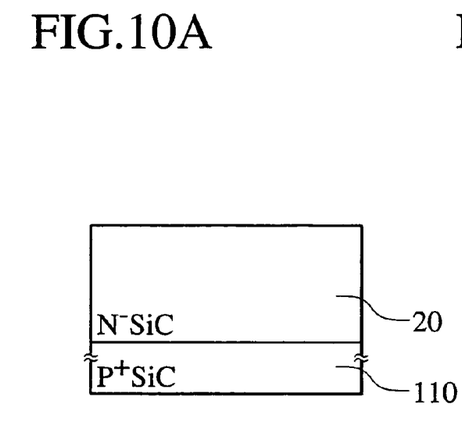
FIGS. 10A to 10E are cross sectional views showing one example of the manufacturing method of the silicon carbide semiconductor device in accordance with the embodiment 5.

First, in the step of FIG. 10A, an n$^-$-type SiC epitaxial layer 20 having a thickness of 1 to 100 μm is formed with a dopant concentration of $1 \times 10^{14}$ to $1 \times 10^{18}$ cm$^{-3}$ on a p$^+$-type SiC substrate 110 serving as an anode region.

Figure 10B:
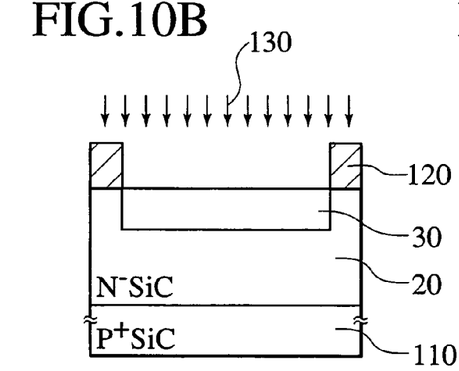

In the step of FIG. 10B, a p-type base region 30 is formed within the n$^-$-type SiC epitaxial layer 20 by injecting boron ions 130 through a mask 120 according to a multi-step ion-implantation with an accelerating voltage of 10 keV to 3 MeV at a high temperature, for example, 100 to 1000° C. The total dose amount is for example $10^{12}$ to $10^{16}$ cm$^{-2}$.

Figure 10C:
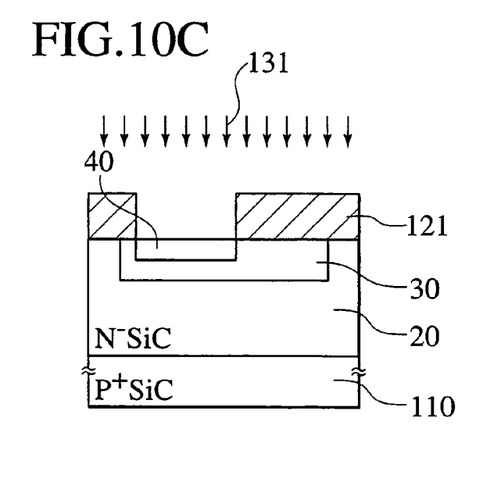

In the step of FIG. 10C, an n$^+$-type cathode region 40 is formed within the p-type base region 30 by injecting thereto, for example, phosphor ions 131 through a mask 121 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$. Needless to say, besides phosphorus, nitrogen, arsenicum and the like can be used as an n-type impurity.

Figure 10D:
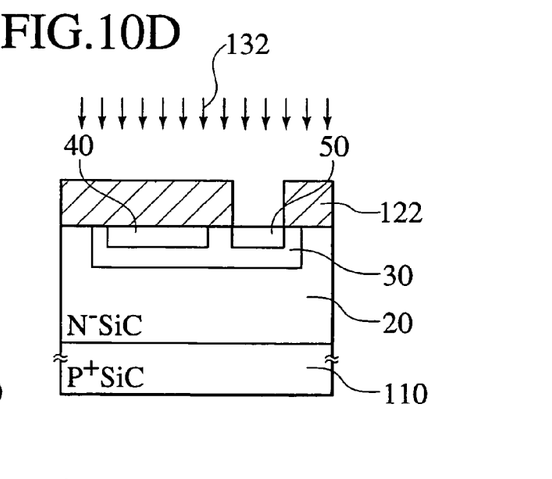

In the step of FIG. 10D, a p$^+$-type gate region 50 is formed within the p-type base region 30 by injecting thereto aluminum ions 132 through a mask 122 according to a multi-step ion-implantation with an accelerating voltage of 10 keV to 1 MeV at a high temperature, for example, 100 to 1000° C. The total dose amount is for example $10^{14}$ to $10^{16}$ cm$^{-2}$.

Incidentally, the p$^+$-type gate region 50 is preferably formed with an impurity which can be used to generate a shallow impurity level in the silicon carbide semiconductor and therefore aluminum is used for this purpose in the present embodiment 5.

Also, needless to say, the sequential order of the above ion-implantation steps of forming the respective regions can be changed so that, for example, phosphor ions can be first implanted for forming the n$^+$-type cathode region 40.

Figure 10E:
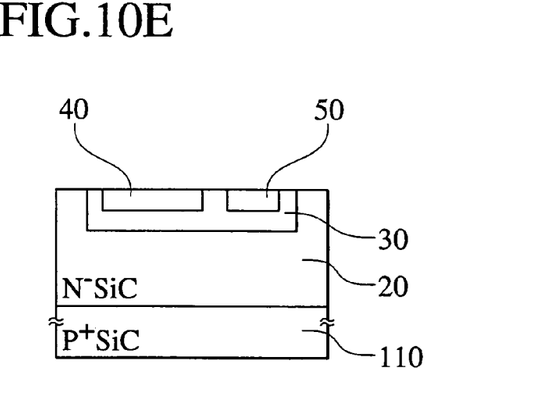

In the step of FIG. 10E, a thermal treatment is given to the silicon carbide semiconductor, for example, at 1000 to 1800° C. in order to move impurity ions in the lattice positions of the silicon carbide semiconductor.

Thereafter, not shown in the figure, after forming a CVD oxide film on the silicon carbide semiconductor as the interlayer film 60, contact holes are opened through the CVD oxide film over the n$^+$-type cathode region 40 and the p$^+$-type gate contact region 50 followed by forming the cathode electrode 70 and the gate electrode 80 respectively in the contact holes to contact the n$^+$-type cathode region 40 and the p$^+$-type gate contact region 50 respectively. A metal film is then formed on the rare surface of the p$^+$-type SiC substrate 110 by evaporation and given thermal treatment, for example, at 600 to 1400° C. to be the anode electrode 90 an ohmic electrode. The silicon carbide semiconductor device as illustrated in FIG. 9 is then completed in accordance with the embodiment 5.

Next, the operation of the semiconductor device in accordance with the present embodiment 5 will be explained.

When a positive voltage is applied to the cathode electrode 70 while a negative voltage is applied to the anode electrode 90, a reverse bias is applied across the PN junction between the n$^+$-type cathode region 40 and the p-type base region 30 and also across the PN junction between the n$^-$-type epitaxial layer 20 and the p$^+$-type SiC substrate 110, and therefore no current flows irrespective of the voltage applied to the gate.

On the other hand, when a positive voltage is applied to the anode electrode 90 while a negative voltage is applied to the cathode electrode 70, no current flows if the gate voltage is zero or negative. In this case, a depletion layer is extending in the epitaxial layer 20 corresponding to the anode voltage Va with little extension in the p-type base region 30. This is because the space charge density of the depletion layer extending in the p-type base region 30 is designed larger than the space charge density of the depletion layer extending in the epitaxial layer 20 by one or more orders of magnitude as described above.

Hence, the current from the anode electrode 90 to the cathode electrode 70 starts rapidly increasing only after the anode voltage Va reaches the breakdown voltage Vb, but the depletion layer in the p-type base region 30 shall not extend to reach the n⁺-type cathode region 40 to cause punch-through in advance of the breakdown.

On the other hand, when a positive voltage is applied to the gate electrode 80, positive holes are injected from the gate electrode 80 into the p-type base region 30. At the same time, a large amount of electrons move from the n⁺-type cathode region 40 to the p-type base region 30.

If the free carrier density in the p-type base region 30 is large, a majority of electrons injected from the cathode region 40 are recombined with positive holes in the p-type base region 30, and therefore few electrons reach the epitaxial layer 20.

The present semiconductor device is formed with the p-type base region 30 doped with boron as described above, and therefore characterized in that the free carrier density thereof at room temperature is smaller than the space charge density of the depletion layer formed in the p-type base region 30 by about two orders of magnitude. For this reason, even if the space charge density of the depletion layer extending in the p-type base region 30 is so large as to avoid punch-through, the free carrier density is smaller than the space charge density of the depletion layer at room temperature by about two orders of magnitude.

As a result, a majority of electrons transported to the p-type base region 30 are passed to reach the n⁻-type epitaxial layer 20. The majority of electrons are then absorbed into the epitaxial layer 20 in the electric field induced by the anode voltage and passed to the p⁺-type SiC substrate 110. At the same time, positive holes are injected from the p⁺-type SiC substrate 110 to the epitaxial layer 20 and collected by the p-type base region 30. These positive holes are then injected from the p-type base region 30 to the cathode region 40 to turn on the thyristor as a conductor with a low resistance.

Particularly, in the case of the present embodiment 5, the p-type base region 30 is formed with boron as a dopant which can be used to generate a deep impurity level within the silicon carbide semiconductor, and therefore it is possible to reduce the free carrier density in the p-type base region 30 and a number of carriers recombined in the p-type base region 30, and provide a thyristor with low on-resistance as compared with prior art thyristors.

Embodiment 6

Figure 11:
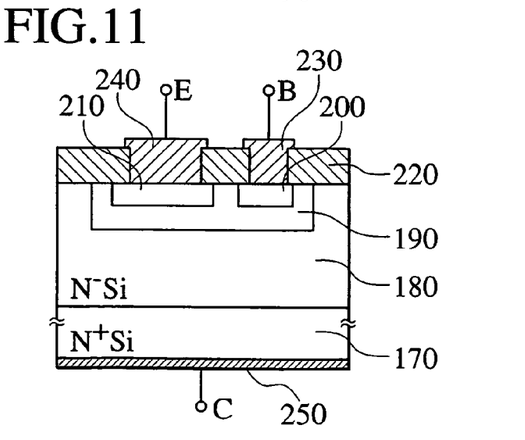
FIG. 11 is a cross sectional view showing the structure of an embodiment 6 of the semiconductor device in accordance with the invention.

FIG. 11 is a cross sectional view showing the structure of an embodiment 6 of the silicon semiconductor device in accordance with the invention. The present embodiment 6 is applicable to a high voltage silicon semiconductor bipolar transistor in which a p-type base region is formed with Tl (thalium) as a dopant.

The difference of the present embodiment 6 resides in that the SiC semiconductor substrate 10 is replaced by a silicon semiconductor substrate 170. The other structures and functionality are similar to those of the high withstanding voltage SiC bipolar transistor according to the embodiment 1 as described above in conjunction with FIG. 1, and therefore redundant explanation is dispensed with.

Next, one example of the manufacturing method of the silicon semiconductor device in accordance with the present embodiment 6 will be explained with reference to the cross sectional views shown in FIGS. 12A to 12E.

Figure 12A:
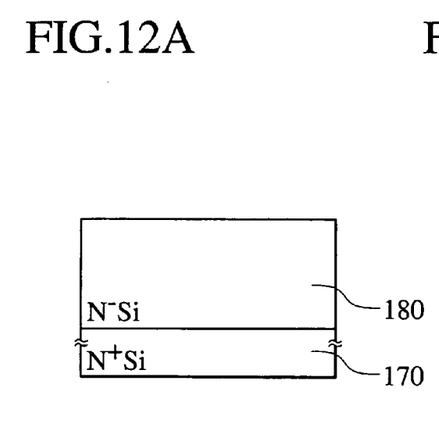
FIGS. 12A to 12E are cross sectional views showing one example of the manufacturing method of the silicon carbide semiconductor device in accordance with the embodiment 6.

First, in the step of FIG. 12A, an n⁻-type Si epitaxial layer 180 having a thickness of 1 to 100 μm is formed on an n⁺-type Si substrate 170 as a collector region with a dopant concentration of $1\times10^{14}$ to $1\times10^{18}$ cm⁻³.

Figure 12B:
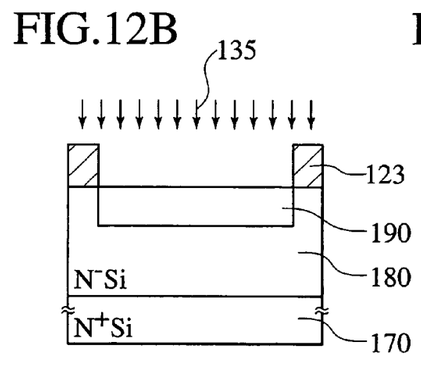

In the step of FIG. 12B, a p-type base region 190 is formed within the n⁻-type Si epitaxial layer 180 by injecting thalium ions 135 through a mask 123 with an accelerating voltage of 10 keV to 500 keV. The total dose amount is for example $10^{12}$ to $10^{16}$ cm⁻².

While the p-type base region 190 is formed by ion-implantation of thalium in accordance with the present embodiment 6, In (indium) can be used in place of thalium.

Also, the p-type base region 190 can be formed by epitaxial growth with one of these impurities in the form of an appropriate dopant gas available for the purpose of doping the epitaxial layer.

Figure 12C:
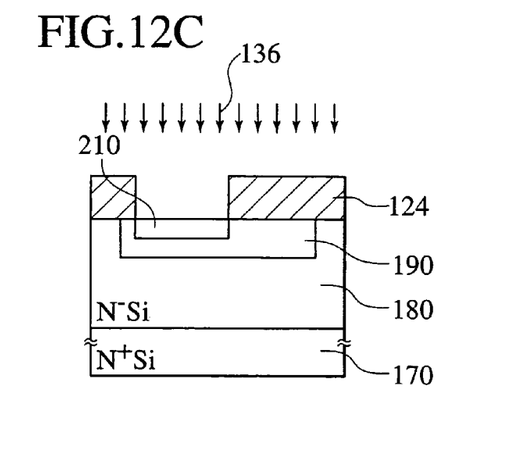

In the step of FIG. 12C, an n⁺-type emitter region 210 is formed within the p-type base region 190 by injecting thereto, for example, phosphor ions 136 through a mask 124 with an accelerating voltage of 10 keV to 500 keV. The total dose amount is for example $10^{14}$ to $10^{16}$ cm⁻². Needless to say, besides phosphorus, arsenicum and the like can be used as an n-type impurity.

Figure 12D:
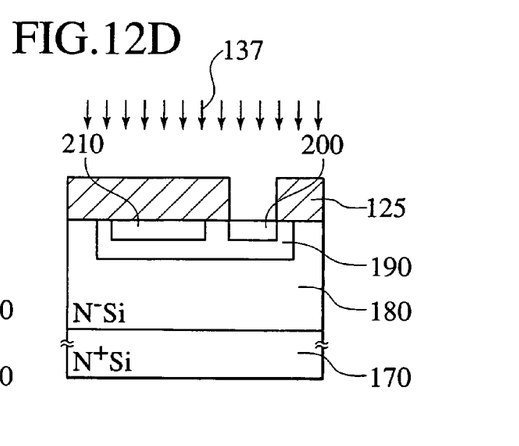

In the step of FIG. 12D, a p⁺-type base contact region 200 is formed within the p-type base region 190 by injecting thereto, for example, boron ions 137 through a mask 125 with an accelerating voltage of 10 keV to 500 keV. The total dose amount is for example $10^{14}$ to $10^{16}$ cm⁻².

Also, needless to say, the sequential order of the above ion-implantation steps of forming the respective regions can be changed so that, for example, phosphor ions can be first implanted for forming the n⁺-type emitter region 210.

Figure 12E:
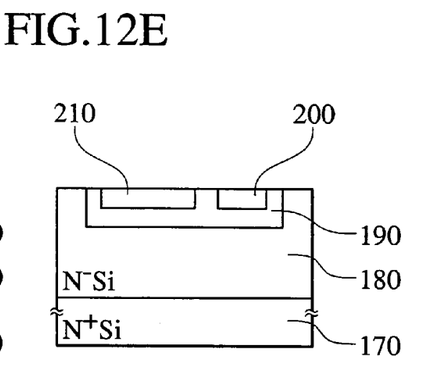

In the step of FIG. 12E, a thermal treatment is given to the silicon semiconductor, for example, at 1000° C. in order that impurity ions are diffused to a predetermined depth.

Thereafter, not shown in the figure, after forming a CVD oxide film on the silicon semiconductor as the interlayer film 220, contact holes are opened through the CVD oxide film over the n⁺-type emitter region 210 and the p⁺-type base contact region 200 followed by forming the emitter electrode 240 and the base electrode 230 respectively in the contact holes to contact the n⁺-type emitter region 210 and the p⁺-type base contact region 200 respectively. Furthermore, a metal film is then formed on the rare surface of the n⁺-type Si substrate 170 as the collector electrode 250 by evaporation to complete the manufacturing process of the silicon semiconductor device as illustrated in FIG. 11 in accordance with the embodiment 6.

By this configuration, a conventional silicon semiconductor manufacturing apparatus can be used without difficulty to manufacture a silicon semiconductor device, in accordance with the invention, in which is improved the conventional problem relating to the tradeoff existing between the withstanding voltage of the device and the current gain hFE.

The present application is related to subject matter disclosed in the Japanese Patent Application No. 2003-036364 filed in Feb. 14, 2003 in Japan, to which the present application claims priority under the Paris Convention and which are incorporated herein by reference.

The foregoing description of the embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor device comprising:
   a collector region of a first conduction type;
   an emitter region of the first conduction type;
   a base region of a second conduction type opposite to the first conduction type located between the collector region and the emitter region,
   wherein the base region includes a punch-through stop region of the second conduction type adjacent to the emitter region, and
   wherein the free carrier density of the punch-through stop region where no depletion layer is formed is smaller than the space charge density of a depletion layer formed in the punch-through stop region.

2. The semiconductor device as claimed in claim 1, wherein the space charge density of the base region is smaller than the space charge density of the punch-through stop region.

3. The semiconductor device as claimed in claim 1, wherein the free carrier density of the punch-through stop region where no depletion layer is formed is smaller than the space charge density of a depletion layer formed in the punch-through stop region by one or more orders of magnitude.

4. The semiconductor device as claimed in claim 1, comprising a silicon carbide semiconductor as a base semiconductor material.

5. A manufacturing method of manufacturing a semiconductor device according to claim 4, the manufacturing method comprising:
   forming the base region;
   covering the base region with a mask;
   patterning the mask to form an opening through which part of the base region is exposed;
   forming the emitter region by doping the base region with an impurity of the first conduction type through the mask; and
   forming a punch-through stop region by doping the base region with a first impurity of a second conduction type which serves to generate an impurity level with a predetermined depth from the edge of the band gap of a base semiconductor material of the semiconductor device while the free carrier density is smaller than the space charge density by a predetermined value.

6. The manufacturing method of manufacturing a semiconductor device as claimed in claim 5, wherein the impurity with which the base region is doped is a second impurity of the second conduction type which serves to generate an impurity level with a depth from the edge of the band gap of the base semiconductor material shallower than the predetermined depth of the first impurity.

7. The manufacturing method of manufacturing a semiconductor device as claimed in claim 5, wherein the base region is formed by semiconductor epitaxial growth.

8. The manufacturing method of manufacturing a semiconductor device as claimed in claim 6, wherein the semiconductor device is made of a silicon carbide semiconductor as a base semiconductor material.

9. The manufacturing method of manufacturing a semiconductor device as claimed in claim 8, wherein the first impurity is an impurity which can be used to generate an impurity level apart from the edge of the band gap of the base semiconductor material by more than 250 meV.

10. The manufacturing method of manufacturing a semiconductor device as claimed in claim 8, wherein the second impurity is an impurity which can be used to generate an impurity level at positions shallower than the positions 250 meV apart from the edge of the band gap of the base semiconductor material.

11. The manufacturing method of manufacturing a semiconductor device as claimed in claim 8, wherein the first impurity is boron.

12. The manufacturing method of manufacturing a semiconductor device as claimed in claim 8, wherein the second impurity is aluminum.

* * * * *